(12) United States Patent
Demkov et al.

(10) Patent No.: US 7,365,410 B2
(45) Date of Patent: Apr. 29, 2008

(54) SEMICONDUCTOR STRUCTURE HAVING A METALLIC BUFFER LAYER AND METHOD FOR FORMING

(75) Inventors: Alexander A. Demkov, Austin, TX (US); William J. Taylor, Jr., Round Rock, TX (US)

(73) Assignee: Freescale, Semiconductor, Inc., Austin, TX (US)

( * ) Notice: Subject to any disclaimer, the term of this patent is extended or adjusted under 35 U.S.C. 154(b) by 378 days.

(21) Appl. No.: 10/977,727

(22) Filed: Oct. 29, 2004

(65) Prior Publication Data
US 2006/0094249 A1 May 4, 2006

(51) Int. Cl.
H01L 29/12 (2006.01)
H01L 29/16 (2006.01)
H01L 29/161 (2006.01)

(52) U.S. Cl. ............ 257/506; 257/616; 257/65; 257/66; 438/486

(58) Field of Classification Search ........... 438/166, 438/424, 492, 486; 257/65, 66, 75, 506, 257/616, E21.09, E21.13
See application file for complete search history.

(56) References Cited

U.S. PATENT DOCUMENTS

| | | | | |
|---|---|---|---|---|
| 5,264,072 | A * | 11/1993 | Mukai | 117/43 |
| 5,582,640 | A * | 12/1996 | Okada et al. | 117/8 |
| 5,897,347 | A * | 4/1999 | Yamazaki et al. | 438/166 |
| 6,048,758 | A * | 4/2000 | Yamazaki et al. | 438/166 |
| 6,399,454 | B1 * | 6/2002 | Yamazaki | 438/308 |
| 6,448,118 | B2 * | 9/2002 | Yamazaki et al. | 438/166 |
| 6,583,034 | B2 * | 6/2003 | Ramdani et al. | 438/507 |
| 6,690,072 | B2 | 2/2004 | Cabral, Jr. et al. | |
| 6,709,989 | B2 | 3/2004 | Ramdani et al. | |
| 6,723,661 | B2 | 4/2004 | Fitzergald | |
| 6,724,008 | B2 | 4/2004 | Fitzergald | |
| 6,913,956 | B2 * | 7/2005 | Hamada et al. | 438/149 |
| 6,939,755 | B1 * | 9/2005 | Ohtani et al. | 438/166 |
| 7,052,943 | B2 * | 5/2006 | Yamazaki et al. | 438/166 |
| 2003/0032221 | A1 * | 2/2003 | Kasahara et al. | 438/149 |
| 2003/0034500 | A1 * | 2/2003 | Demkov et al. | 257/120 |

OTHER PUBLICATIONS

Bojarszuk, N.A. et al.; "Epitaxial silicon and germanium on buried insulator heterostructures and devices"; Applied Physics Letters; Dec. 29, 2003; pp. 5443-5445; vol. 83, No. 26; American Institute of Physics.

Ishiwara, Hiroshi et al.; "Characterization of Epitaxial Silicide Films on SI Substrates by Ion Channeling and Backscattering Techniques"; Semiconductor Technologies 1982; pp. 55-68.

* cited by examiner

*Primary Examiner*—M. Wilczewski
(74) *Attorney, Agent, or Firm*—Joanna G. Chiu; Daniel D. Hill

(57) ABSTRACT

A method for forming a semiconductor structure including providing a semiconductor substrate, forming a metallic buffer layer over the semiconductor substrate, forming an amorphous semiconductor layer over the metallic buffer layer, and recrystallizing the amorphous semiconductor layer to form a crystalline semiconductor layer. A semiconductor structure includes a semiconductor substrate, a buffer layer comprising at least one of silicide and germanide formed over the semiconductor substrate, and a crystalline semiconductor layer formed over the metallic buffer layer.

6 Claims, 2 Drawing Sheets

SEMICONDUCTOR STRUCTURE HAVING A METALLIC BUFFER LAYER AND METHOD FOR FORMING

FIELD OF THE INVENTION

The present invention relates generally to semiconductor processing, and more specifically, to a semiconductor structure having a metallic buffer layer and method for forming.

RELATED ART

In semiconductor processing, some applications require the need to form a first semiconductor layer over a second semiconductor layer where the first and second semiconductor layers have different lattice constants. For example, in forming some semiconductor structures, silicon germanium needs to be formed on top of a silicon layer. However, since silicon germanium has a different lattice constant than silicon, misfit dislocations occur at the interface of the silicon germanium and silicon. These misfit dislocations degrade device performance. In one solution known today, graded layers of silicon germanium up to a few microns thick are used to provide a transition from silicon to relatively low defectivity silicon germanium. However, these graded layers increase the required thickness for the semiconductor layers, which increase material and processing costs. Therefore, a need exists for an improved method for forming a semiconductor structure having layers of different lattice constants.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment of the present invention, a semiconductor structure is formed having a first semiconductor layer, a metallic buffer layer over the first semiconductor layer, and a second semiconductor layer over the metallic buffer layer where the first and second semiconductor layers have different lattice constants. The properties of the metallic buffer layer allow for the second semiconductor layer to relax while reducing or preventing the formation of misfit dislocations.

Figure 1:
FIGS. 1-4 illustrate, in cross-sectional views, a semiconductor structure at various processing stages in accordance with one embodiment of the present invention.

FIGS. 1-4 illustrate, in cross-sectional views, a method for forming a semiconductor structure having a metallic buffer layer in accordance with one embodiment of the present invention. FIG. 1 illustrates a cross-sectional view of a semiconductor structure 10. FIG. 1 includes a semiconductor layer 12 and a metal layer 14 overlying semiconductor layer 12. In one embodiment, semiconductor layer 12 may be formed of any semiconductor material, such as, for example, silicon (Si), germanium (Ge), silicon germanium ($Si_{1-x}Ge_x$, where 0<x<1), gallium arsenide (GaAs), etc. Semiconductor layer 12 may be a bulk substrate or a semiconductor-on-insulator (SOI) substrate including a semiconductor layer (formed of any semiconductor material, as listed above) overlying an insulating layer (such as, for example, a buried oxide layer) which overlies a support layer (formed, for example, of any type of material which provides support to the insulating layer and semiconductor layer). Also, semiconductor layer 12 is generally a monocrystalline semiconductor layer. In the descriptions herein, for ease of explanation, it will be assumed that semiconductor layer 12 is monocrystalline silicon.

Metal layer 14 may be formed using, for example, atomic layer deposition (ALD), physical vapor deposition (PVD), or chemical vapor deposition (CVD). If semiconductor layer 12 is silicon, metal layer 14 may include metals such as, for example, nickel (Ni), palladium (Pd), manganese (Mn), iron (Fe), cobalt (Co), molybdenum (Mo), ruthenium (Ru), rhodium (Rh), tungsten (W), osmium (Os), or combinations thereof. For example, in one embodiment, metal layer 14 may include nickel and palladium.

Figure 2:
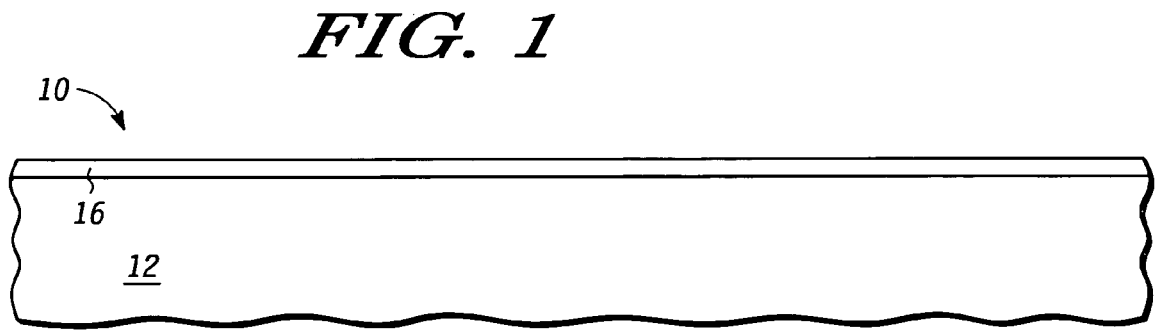

FIG. 2 illustrates semiconductor structure 10, after metal layer 14 is reacted to form a metallic buffer layer 16. In one embodiment, metallic buffer layer 16 has a thickness in a range of about 0.5 to 2 nanometers. For example, assuming semiconductor layer 12 is Si, metal layer 14 is reacted to form metal buffer layer 16 (which, in this embodiment, may also be referred to as metal silicide layer 16). Therefore, depending on the metal layer used, different metal silicide layers may be formed. For example, metal silicide layer 16 may include $NiSi_2$, $PdSi_2$, $MnSi_2$, $FeSi_2$, $CoSi_2$, $MoSi_2$, $Ru_2Si_3$, $RhSi$, $WSi_2$, $OsSi_2$, $Ni_2Pd_2Si_4$, or $Ni_3PdSi_4$. The material for metal silicide layer 16 is chosen such that the lattice constant of the metal silicide approximately matches the lattice constant of underlying semiconductor layer 12. In this manner, the metal silicide layer, formed over monocrystalline silicon, will be crystalline in structure.

Figure 3:
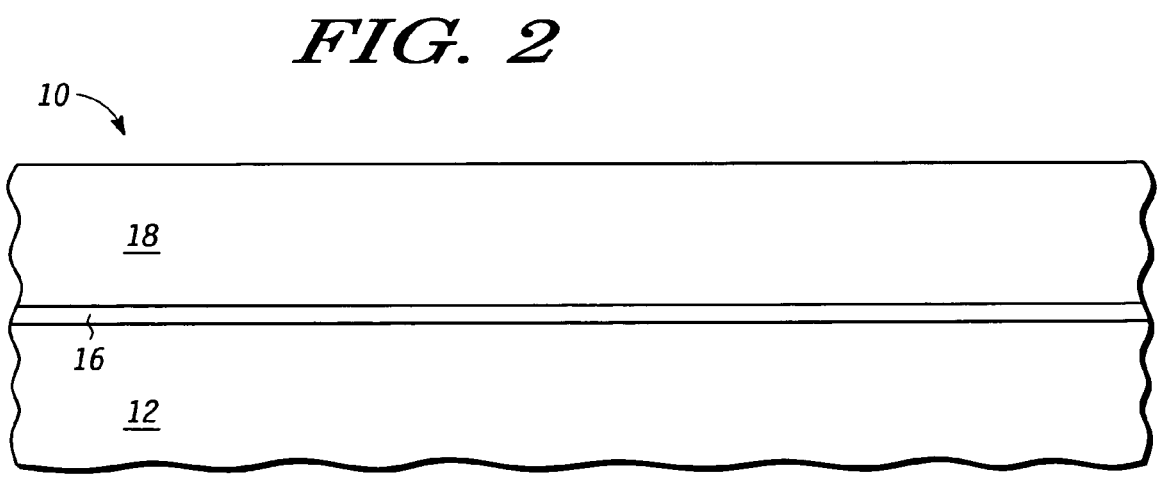
Figure 4:
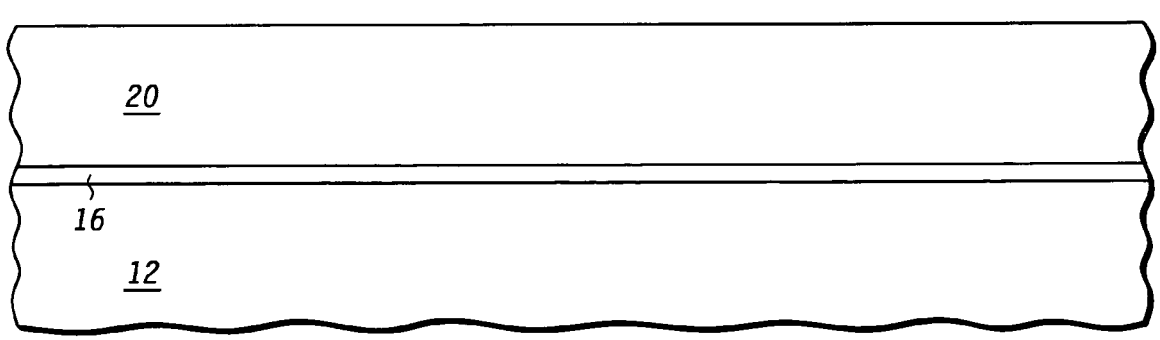

FIG. 3 illustrates semiconductor structure 10, after formation of an amorphous semiconductor layer 18 over metallic buffer layer 16. In one embodiment, amorphous semiconductor layer 18 may be formed using CVD. Amorphous semiconductor layer 18 may be any semiconductor layer, such as, for example, $Si_{1-x}Ge_x$ (where 0.1<x<1.0), Si, Ge, or GaAs. FIG. 4 illustrates semiconductor structure 10 after recrystallization of amorphous semiconductor layer 18 to form a substantially crystalline semiconductor layer 20. In one embodiment, the recrystallization may be formed with solid phase epitaxy (SPE) which may include annealing for a time between about 10 and 3600 seconds at a temperature between about 350 and 700 degrees Celsius.

In one embodiment, in which semiconductor layer 12 is monocrystalline silicon, amorphous semiconductor layer 18 is $Si_{1-x}Ge_x$ (where 0.1<x<1.0). Amorphous semiconductor layer 18 is then recrystallized to form a substantially crystalline $Si_{1-x}Ge_x$ layer 20. Note that this substantially crystalline $Si_{1-x}Ge_x$ layer 20 is substantially relaxed due to the properties of metal silicide layer 16 at the interface between Si layer 12 and $Si_{1-x}Ge_x$ layer 20. Metallic buffer layer 16 may therefore reduce or prevent the formation of misfit dislocations resulting in an improved quality semiconductor layer (e.g. semiconductor layer 20).

Figure 5:
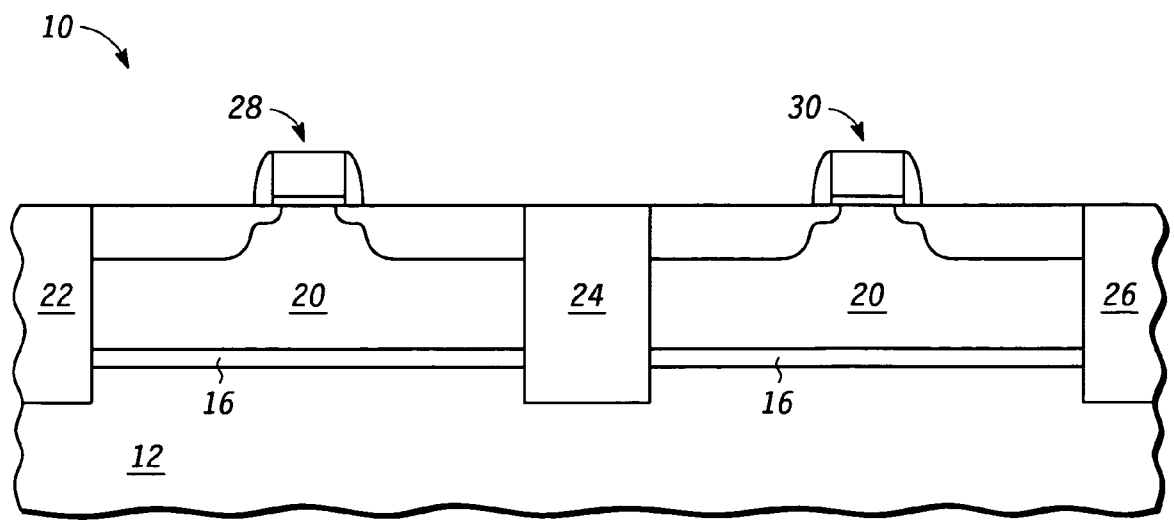
FIG. 5 illustrates, in a cross-sectional view, the semiconductor structure of FIG. 4 having devices formed therein, in accordance with one embodiment of the present invention.

FIG. 5 illustrates semiconductor structure 10 after formation of isolation trenches 22, 24, and 26, and devices 28 and 30. In one embodiment, isolation trenches such as isolation trenches 22, 24, and 26 are formed extending through crystalline semiconductor layer 20 and through metallic buffer layer 16 into semiconductor layer 12. In this manner, devices may be electrically isolated from one another by these isolation trenches. Note that isolation trenches 22, 24, and 26 may be formed using conventional processing and may be filled with a dielectric material, such as, for example, an oxide. Device 28 is formed between isolation trenches 22 and 24 and device 30 is formed between trenches 24 and 26. Since isolation trenches 22, 24, an 26 extend completely through metallic buffer layer 16, the wells in which devices 28 and 30 are formed are electrically isolated from each other. Each of devices 28 and 30 may be any type of devices. For example, in the illustrated embodiment, devices 28 and 30 are conventional metal-oxide field effect transistors (MOSFETs). However, any type of devices (active or passive) may be formed in semiconductor layer 20, such as, for example, any type of transistor, floating gate devices, bipolar devices, resistors, diodes, capacitors, etc.

Therefore, it can be appreciated how the use of a metallic buffer layer such as metallic buffer layer 16 provides for an improved substantially crystalline semiconductor layer (e.g. layer 20) over a monocrystalline semiconductor layer (e.g. layer 12) where the lattice constants of the two semiconductor layers do not match. Depending on the materials used for semiconductor layers 12 and 20, different metals for forming metallic buffer layer 16 may be used. For example, in the case of an $Si_{1-x}Ge_x$ (where $0.1<x<1.0$) layer formed over a Si layer, metallic buffer layer 16 is formed as a metal silicide layer. Alternatively, if semiconductor layer 12 were a monocrystalline Ge layer, then metallic buffer layer 16 may be formed as a metal germanide layer. Alternatively, if semiconductor layer 12 were a $Si_{1-x}Ge_x$ (where $0<x<1$) layer, or GaAs layer, then metallic buffer layer 16 may be other types of layers.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor structure comprising:
a semiconductor substrate;
a metallic buffer layer comprising at least one of silicide or germanide formed over the semiconductor substrate;
a crystalline semiconductor layer formed over the metallic buffer layer; and
a transistor formed on the crystalline semiconductor layer, wherein the transistor is isolated using a dielectric extending through the metallic buffer layer.

2. The semiconductor structure of claim 1, wherein the metallic buffer layer is approximately lattice matched to the semiconductor substrate.

3. The semiconductor structure of claim 1, wherein a lattice constant of the crystalline semiconductor layer is different than a lattice constant of the semiconductor substrate.

4. The semiconductor structure of claim 1, wherein the semiconductor substrate is Si.

5. The semiconductor structure of claim 1, wherein the semiconductor substrate comprises Ge.

6. The semiconductor structure of claim 1, wherein the metallic buffer layer is between about 0.5 and 2.0 nanometers thick.

* * * * *